United States Patent
Bellora

(10) Patent No.: US 12,456,562 B2
(45) Date of Patent: Oct. 28, 2025

(54) CERAMIC RF FEEDTHROUGH COMPONENT

(71) Applicant: Integrated Microwave Corporation, San Diego, CA (US)

(72) Inventor: John P. Bellora, San Diego, CA (US)

(73) Assignee: Integrated Microwave Corporation, San Diego, CA (US)

( * ) Notice: Subject to any disclaimer, the term of this patent is extended or adjusted under 35 U.S.C. 154(b) by 0 days.

(21) Appl. No.: 18/428,203

(22) Filed: Jan. 31, 2024

(65) Prior Publication Data

US 2025/0246342 A1    Jul. 31, 2025

(51) Int. Cl.
*H01B 11/00* (2006.01)
*H05K 9/00* (2006.01)

(52) U.S. Cl.
CPC ........... *H01B 11/00* (2013.01); *H05K 9/0015* (2013.01)

(58) Field of Classification Search
CPC .... H01B 11/00; H01B 17/303; H05K 9/0015; H05K 9/007; H05K 9/00; H05K 9/0018; H05K 5/069; H01R 13/405; H01R 13/646; H01R 13/6473; H01R 24/20; H01R 13/52; H02G 3/083; H02G 15/013; H02G 3/18
USPC ......... 174/650, 50.6, 50.56, 50.61, 152 GM; 361/302, 306.1; 607/36, 67, 5; 333/182
See application file for complete search history.

(56) References Cited

U.S. PATENT DOCUMENTS

| | | | | |
|---|---|---|---|---|
| 4,424,551 A | * | 1/1984 | Stevenson | H01G 4/35 |
| | | | | 29/25.42 |
| 5,175,067 A | * | 12/1992 | Taylor | H01M 50/191 |
| | | | | 428/432 |
| 5,227,587 A | * | 7/1993 | Paterek | H01B 17/305 |
| | | | | 174/152 R |
| 6,433,276 B1 | | 8/2002 | Bellora | |
| 6,852,925 B2 | * | 2/2005 | Wolf | H01M 50/172 |
| | | | | 174/50.56 |
| 7,046,499 B1 | * | 5/2006 | Imani | H01G 9/10 |
| | | | | 361/306.1 |
| 8,378,239 B2 | * | 2/2013 | Lakner | H02G 3/22 |
| | | | | 174/50.56 |
| 8,927,862 B2 | * | 1/2015 | Barry | A61N 1/05 |
| | | | | 174/50.56 |
| 9,979,118 B2 | * | 5/2018 | Khadkikar | F04B 53/16 |

OTHER PUBLICATIONS

Knowles, "EMI Filters", www.knowlescapacitors.com, Knowles Capacitors, 2016.

* cited by examiner

*Primary Examiner* — Angel R Estrada
(74) *Attorney, Agent, or Firm* — Hickman Becker Bingham Ledesma LLP; Matthew C. Loppnow

(57) ABSTRACT

A radio frequency (RF) feedthrough component having an impedance greater than 20 ohms is disclosed. The feedthrough includes a ceramic body having a flexible non-ferrous conductor adhered to its outer peripheral surface and to an inner peripheral surface of an aperture through the ceramic body. A non-ferrous conductive lead is disposed through the aperture and protrudes from at least one side thereof. A non-ferrous hermetic seal is formed between a portion of the non-ferrous conductive lead disposed in the aperture and the non-ferrous conductor adhered to the surface of the aperture. The RF feedthrough can be assembled in an opening of a conductive housing to form an electromagnetically shielded package for an electrical circuit.

14 Claims, 2 Drawing Sheets

CERAMIC RF FEEDTHROUGH COMPONENT

FIELD OF THE DISCLOSURE

The present disclosure relates generally to radio frequency (RF) feedthrough components and more particularly to ceramic RF feedthroughs suitable for use in hermetically sealed electrical circuit packages, and combinations thereof.

BACKGROUND

Electrical circuits enclosed in hermetically sealed packages generally comprise electrical leads or pins through which current and electrical signals are communicated to and from the circuit. The hermetic seal is necessary to prevent infiltration of fluids, particulates and other environmental contaminants. The packages typically comprise a conductive housing made from a metal or a metal-clad insulator. The conductive housing electrically shields the electrical circuit from external interference and prevents the circuit from causing interference outside the package.

The electrical leads or pins are often integrated with insulated feedthrough components assembled in openings through the conductive housing. The feedthrough component comprises a conductive ferrule disposed about an insulator that electrically isolates the electrical pin or lead from the ferrule. The insulator is typically a borosilicate glass, and the pin and ferrule are both machined from a metal alloy, known as Kovar, having the same coefficient of thermal expansion (CTE) as the glass. During manufacture, the glass is bonded to the ferrule and the electrical pin by firing the parts, positioned in a fixture, that form a glass-to-metal hermetic seal when cooled. Alternatively, the ferrule, glass and pin can be assembled by interference fit. An adhesion layer of nickel and outer gold plating, for corrosion resistance and solderability, is deposited on the exposed Kovar to complete the assembly. The conductive ferrule of the assembled feedthrough is subsequently soldered to the conductive housing to hermetically seal the circuit package.

But the glass-to-metal feedthrough components described herein are laborious and costly to manufacture. Moreover, glass-to-metal feedthroughs are poor conductors of RF energy and are a source of passive intermodulation (PIM) distortion. These adverse effects are attributable to the relatively lossy and ferrous nature of nickel and Kovar. More specifically, non-plated portions of the Kovar pin within the glass insulator attenuate RF signals. Additionally, the skin depth of typical RF frequencies is greater than the thickness of the outer gold plating, resulting in the propagation of RF energy through the lossy nickel and Kovar. Thus, there is an ongoing need for improvements in RF feedthrough components suitable for hermetically sealed electrical circuit packages, and combinations thereof.

BRIEF DESCRIPTION OF THE DRAWINGS

The objects, features and advantages of the present disclosure will become more fully apparent upon consideration of the following detailed description and appended claims in conjunction with the accompanying drawings. The drawings depict only representative embodiments and are not considered to limit the scope of the disclosure.

Those of ordinary skill in the art will appreciate that the drawings are illustrated for simplicity and clarity and therefore may not be drawn to scale and may not include well-known features, that the order of occurrence of actions or steps may be different than the order described, that the order or occurrence of such actions or steps may be performed concurrently unless specified otherwise, and that the terms and expressions used herein have meaning understood by those of ordinary skill in the art except where a different meaning is specifically attributed to them herein.

DETAILED DESCRIPTION

The disclosure relates generally to radio frequency (RF) feedthrough components (also referred to herein as "feedthroughs") and more particularly to ceramic RF feedthroughs suitable for use in hermetically sealed electrical circuit packages, and combinations thereof.

The RF feedthroughs described herein generally comprise a non-ferrous conductor selectively adhered to an outer peripheral surface of a ceramic body and to an inner peripheral surface of an aperture through the ceramic body. A non-ferrous conductive lead is disposed through the aperture and extends from one or both sides thereof. A portion of the non-ferrous conductive lead disposed in the aperture is hermetically sealed to the thick-film conductor adhered to the surface of the aperture. A representative impedance of the ceramic RF feedthroughs described herein is greater than 20 ohms.

Figure 1:
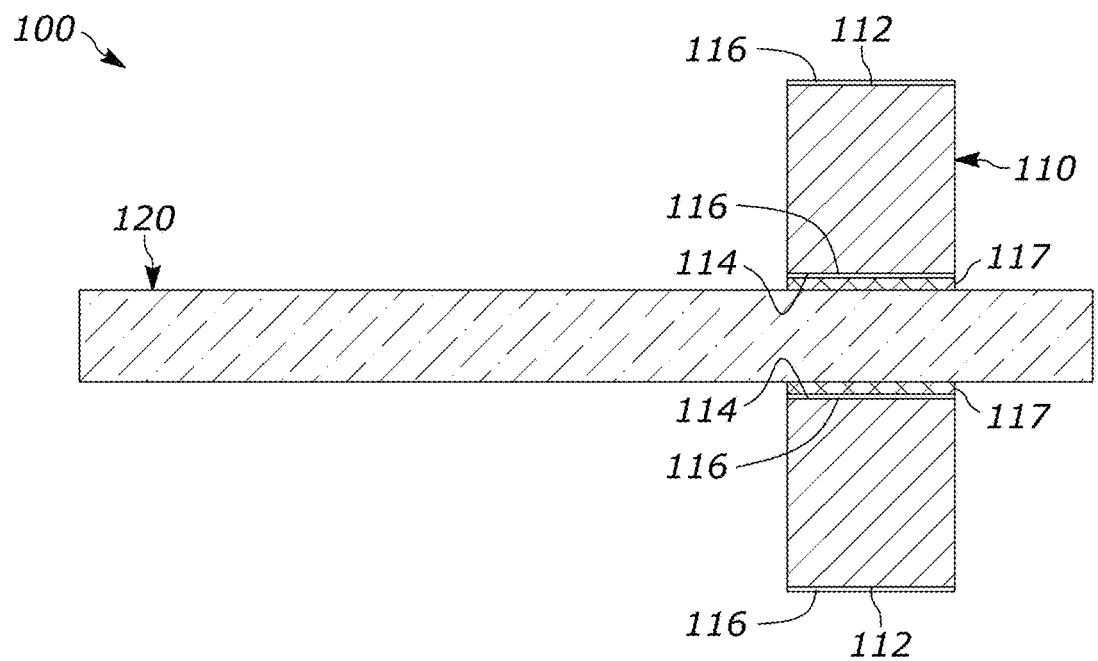
FIG. 1 is a sectional view of a ceramic RF feedthrough component.

In FIG. 1, coaxial radio frequency (RF) feedthrough component 100 comprises an annular ceramic body 110 having an outer peripheral surface 112 and an aperture having an inner peripheral surface 114. Representative ceramic materials include aluminum oxide and aluminum nitride, among other ceramic formulations. Ceramics, particularly Class 1, C0G ceramics, have good temperature stability, from as low as −55° C. to as high as 125° C. More specific ceramic materials characteristics are described further herein.

In FIG. 1, a non-ferrous conductor 116 is adhered to the outer peripheral surface 112 of the ceramic body and to the inner peripheral surface 114 of the aperture. The non-ferrous conductor can comprise silver, palladium or other relatively soft metal, or alloy thereof that can accommodate thermal expansion and contraction of the ceramic body. In one implementation, the non-ferrous metal has a purity of at least ninety percent (90%).

Figure 2:
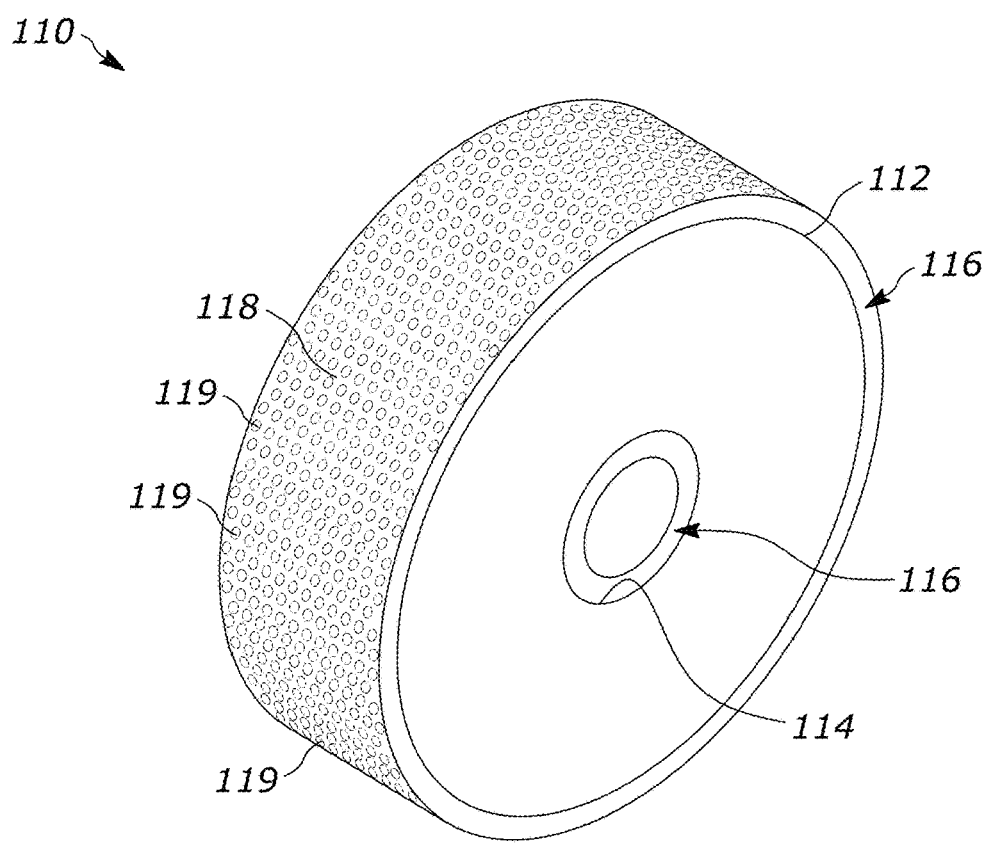
FIG. 2 is a perspective view of a non-ferrous conductor on a ceramic body.

In FIG. 2, the non-ferrous conductor 116 is structured as a flexible metallic web 118 adhered to the outer and inner peripheral surfaces of the ceramic body. The web structure comprises voids 119 that enhance the ability of the soft metal to expand and contract with the ceramic body. In one implementation, the non-ferrous conductor is deposited on the ceramic body using thick-film technology. More specifically, a thick-film paste comprising a soft non-ferrous metal, oxide, or alloy thereof mixed with glass frit in a slurry is applied to select portions of the ceramic body. The thick-film paste can be applied to the ceramic body in a spraying, dipping, screen and stencil printing or other deposition operation. The ceramic body selectively coated with the thick-film paste is subsequently subject to a firing operation during which the glass frit is burned off, resulting in voids in the non-ferrous conductor on the ceramic body. FIG. 2 shows the voids 119 as discrete openings for illustrative purposes. In reality, the voids are microscopic interstitial spaces between constituent elements of the non-ferrous conductor. The voids define the metallic web on the outer and inner peripheral surfaces of the ceramic body and increase flexibility of the non-ferrous conductor. The non-ferrous conductor can have a thickness on the order of 0.0015 inches more or less and can be sequentially built up in layers to increase thickness.

Alternatively, the non-ferrous conductor can be formed on the ceramic body using thin-film technology. Thin-film processes generally comprise sputtering a thin adhesion layer onto select surfaces of the ceramic body before sputtering a conductive layer onto the adhesion layer. In one implementation, the non-ferrous conductive layer comprises a copper film deposited on an adhesion layer and a gold film subsequently deposited on the copper film. One or more other non-ferrous conductive materials can be used in lieu of the representative copper and gold films. In some thin-film processes, the adhesion layer comprises a ferrous compound. Thus, a ceramic RF feedthrough comprising a thin-film non-ferrous conductor deposited on a thin-film ferrous adhesion layer may not perform as well as a ceramic RF feedthrough comprising a non-ferrous thick-film conductor described above. But a ceramic RF feedthrough comprising one or more non-ferrous thin-film conductive layers deposited on a ferrous thin-film adhesion layer will nevertheless perform significantly better (e.g., produce less PIM distortion) than prior art RF feedthroughs comprising Kovar and glass.

In yet another alternative, the non-ferrous conductor can be bonded directly to the ceramic body. Direct bonding processes generally comprise high-temperature oxidation of copper or other non-ferrous conductor in a nitrogen or other suitable atmosphere with a controlled oxygen content. Non-ferrous conductors applied using thin-film or direct bonding technologies may not be as flexible as non-ferrous conductors applied using thick-film technology.

In some implementations, the ceramic RF feedthrough can comprise any combination of thick-film, thin-film or direct bond non-ferrous conductors. For example, one or more thin-film non-ferrous conductors can be deposited on an adhesion layer on the inner surface 114 of the aperture into which the conductive lead is disposed, and a thick-film non-ferrous conductor can be deposited on the outer surface 112 of the ceramic body.

In FIG. 1, a non-ferrous conductive lead 120 disposed through, and fastened to, the aperture of the ceramic body extends from one or both of the opposite sides thereof. A portion of the non-ferrous conductive lead located within the aperture is hermetically sealed with the non-ferrous conductor 116 adhered to the surface of the aperture. The non-ferrous conductive lead can be configured as a pin having a specified diameter or some other sectional shape.

In one implementation, the hermetic seal is formed by a non-ferrous solder 117 shown in FIG. 1. The solder can be a high temperature, non-leaching solder. One such solder is a Sn10 formulated solder predominately comprising lead and lesser amounts of other elements, like silver. Lead solders are relatively soft and will maintain the hermetic seal as the ceramic body expands and contracts in most operational environments. In one implementation, the non-ferrous conductive lead 120 comprises pure silver, or copper coated with pure silver. As used herein, "pure" means a purity not less than ninety (90) percent. Other non-ferrous conductors can be used alternatively.

The RF feedthroughs comprising a non-ferrous metal deposited on a ceramic body described herein are significantly less costly to manufacture than prior art glass-to-metal feedthroughs. Thick-film and other non-ferrous deposition processes are less laborious than the machining of Kovar ferrules and conductive pins and subsequent assembly of prior art glass-to-metal feedthroughs. Further, the ceramic RF feedthroughs described herein exhibit significantly better performance compared to prior art glass-to-metal feedthroughs due in part to a significant reduction in RF attenuation attributable to the use of non-ferrous conductors, reduced PIM distortion and the low CTE of ceramics.

A characteristic impedance of a coaxial ceramic RF feedthrough is given by the following expression (Equation I):

$$Z_o = \frac{1}{2\pi}\sqrt{\frac{\mu}{\epsilon}}\ln\left(\frac{D}{d}\right) \approx \frac{59.96\ \Omega}{\sqrt{\epsilon_r}}\ln\left(\frac{D}{d}\right) \approx \frac{138\ \Omega}{\sqrt{\epsilon_r}}\log_{10}\left(\frac{D}{d}\right)$$

where D is the outer diameter of the ceramic body, d is the diameter of the aperture, and $\epsilon_r$ is the relative dielectric constant of the ceramic body.

The ceramic RF feedthroughs described herein can have any characteristic impedance. Representative ceramic RF feedthroughs described herein have a characteristic impedance greater than 20 ohms. Characteristic impedances of 50 ohms and 75 ohms are most common. A feedthrough having a 50 ohms impedance is commonly used for RF (including microwave) applications, among others. A feedthrough having a 75 ohms impedance is commonly used for cable and satellite television and video applications, among others. Other less common RF feedthrough characteristic impedances include 125 ohms used in the aerospace industry, and 92 ohms specified by the Nuclear Instrumentation Module (NIM) standard for experimental research, among others.

For most RF feedthrough applications, electrical and mechanical constraints of the host device dictate the characteristic impedance and dimensions of the RF feedthrough as suggested by Equation I. Representative non-ferrous conductive pin dimensions and ceramic body dimensions for coaxial ceramic RF feedthroughs described herein having 50 ohms and 75 ohms impedances are shown in Table I below.

TABLE I

| Ohms | Pin Diameter | Dielectric | Outer Diameter | Inner Diameter | Cutoff Frequency (GHz) |
|---|---|---|---|---|---|
| 50 | 0.009 | 5 | 0.071 | 0.011 | 74.33823738 |
| 50 | 0.015 | 5 | 0.110 | 0.017 | 47.98195322 |
| 50 | 0.018 | 5 | 0.129 | 0.020 | 40.91484383 |
| 50 | 0.020 | 5 | 0.142 | 0.022 | 37.16911869 |
| 50 | 0.030 | 5 | 0.206 | 0.032 | 25.62143133 |
| 50 | 0.009 | 9 | 0.134 | 0.011 | 29.35820896 |
| 50 | 0.015 | 9 | 0.208 | 0.017 | 18.91346154 |
| 50 | 0.018 | 9 | 0.240 | 0.020 | 16.39166667 |
| 50 | 0.020 | 9 | 0.269 | 0.022 | 14.62453532 |
| 50 | 0.030 | 9 | 0.390 | 0.032 | 10.08717949 |
| 75 | 0.009 | 5 | 0.180 | 0.011 | 29.32230474 |
| 75 | 0.015 | 5 | 0.279 | 0.017 | 18.91761596 |
| 75 | 0.009 | 9 | 0.470 | 0.011 | 8.370212766 |

A lowpass cutoff frequency of a coaxial ceramic RF feedthrough is given by the following expression (Equation II):

$$\text{Cutoff Frequency (GHz)} = \frac{11.8}{\sqrt{\varepsilon_r} \times \pi \times \left(\frac{D+d}{2}\right)}$$

where D is the outer diameter of the ceramic body, d is the diameter of the aperture, and $\varepsilon_r$ is the relative dielectric constant of the ceramic body. Table I above includes cutoff frequencies for the representative feedthroughs having 50 ohms and 75 ohms impedances described herein. The 50 ohms coaxial ceramic RF feedthroughs comprise lowpass cutoff frequencies between 75 GHz and 10 GHz. The 75 ohms coaxial ceramic RF feedthroughs comprise lowpass cutoff frequencies between 30 GHz and 8 GHz. Other cutoff frequencies can be selected by appropriate selection of the dimensions and dielectric constant of the ceramic body.

In one representative 50 ohms implementation shown in Table I, the RF feedthrough component is a coaxial device, the non-ferrous conductive lead comprises a pin having a diameter between 0.009 inches and 0.030 inches, the ceramic body has a dielectric constant of 5, an inner diameter of the ceramic body is between 0.011 inches and 0.032 inches, and an outer diameter of the ceramic body is between 0.071 inches and 0.0206 inches.

In another representative 50 ohms implementation shown in Table I, the RF feedthrough component is a coaxial device, the non-ferrous conductive lead comprises a pin having a diameter between 0.009 inches and 0.030 inches, the ceramic body has a dielectric constant of 9, an inner diameter of the ceramic body is between 0.011 inches and 0.032 inches, and an outer diameter of the ceramic body is between 0.134 inches and 0.390 inches.

In one representative 75 ohms implementation shown in Table I, the RF feedthrough component is a coaxial device, the non-ferrous conductive lead comprises a pin having a diameter between 0.009 inches and 0.015 inches, the ceramic body has a dielectric constant of 5, an inner diameter of the ceramic body is between 0.011 inches and 0.017 inches, and an outer diameter of the ceramic body is between 0.180 inches and 0.279 inches.

In another representative 75 ohms implementation shown in Table I, the RF feedthrough component is a coaxial device, the non-ferrous conductive lead comprises a pin having a diameter of 0.009 inches, the ceramic body has a dielectric constant of 9, an inner diameter of the ceramic body is 0.011 inches, and an outer diameter of the ceramic body is 0.470 inches.

More generally, the characteristic impedance, dimensions and dielectric constant of the ceramic RF feedthrough can be different than the examples in Table I.

Figure 3:
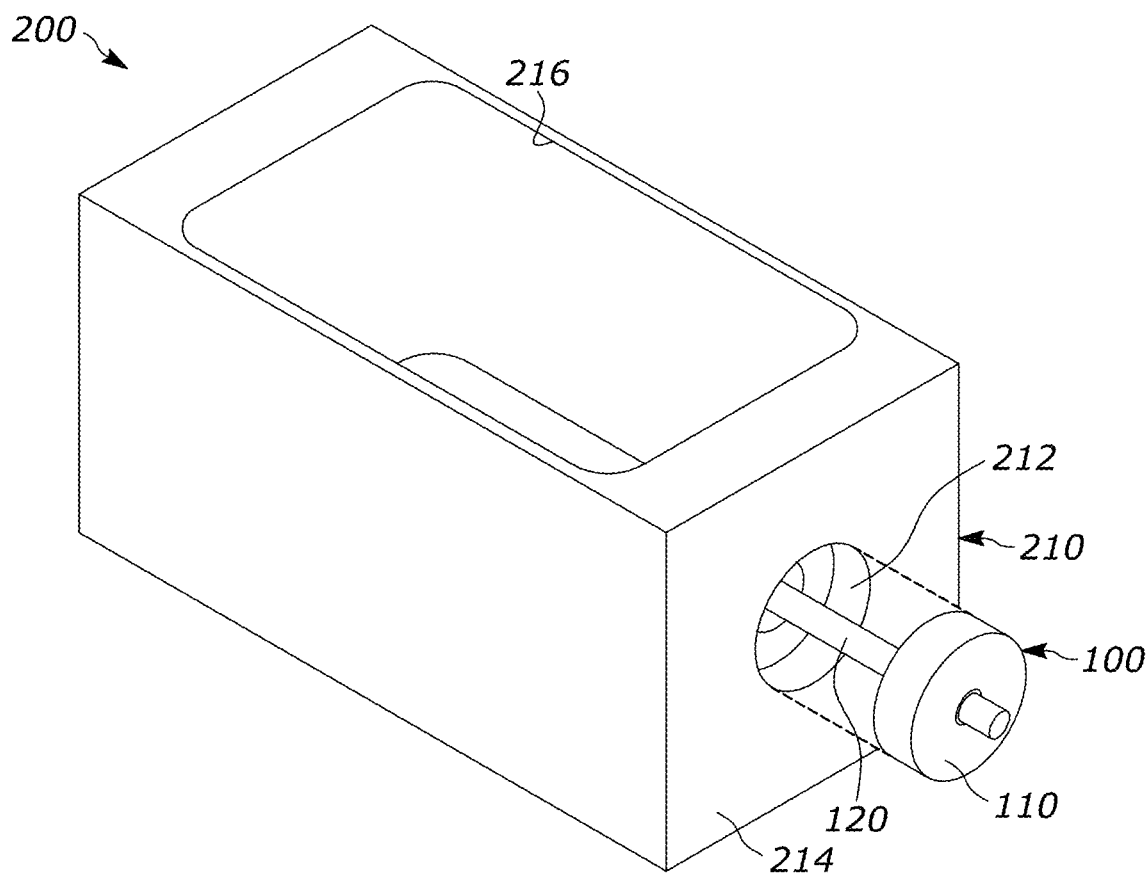
FIG. 3 is a partially exploded view of ceramic RF feedthrough component and a conductive housing.
Figure 4:
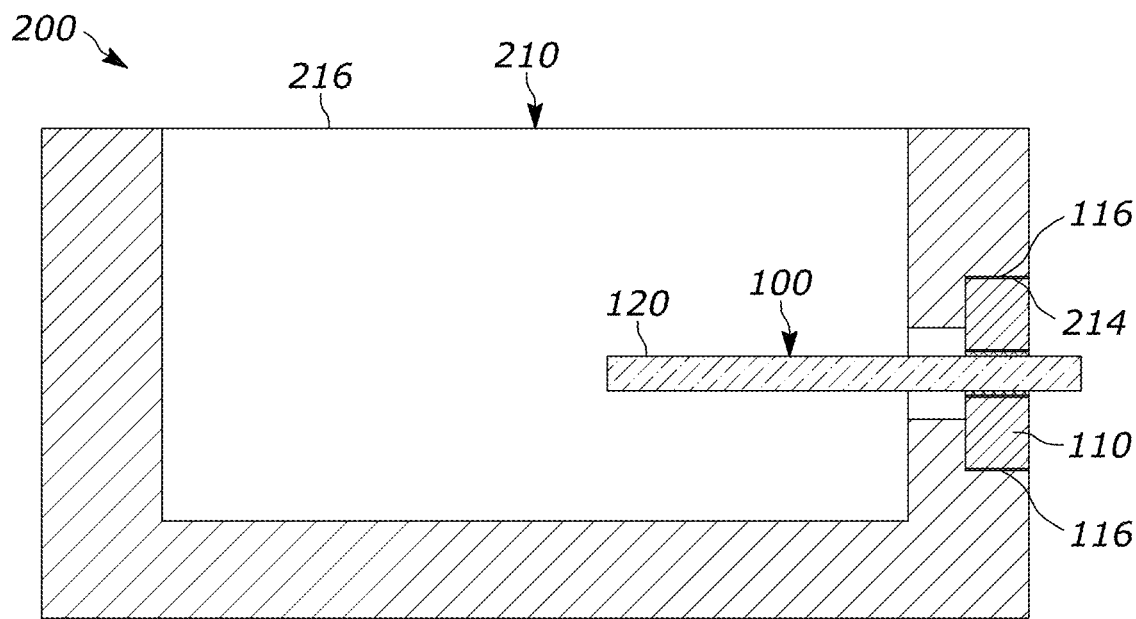
FIG. 4 is a sectional view of a ceramic RF feedthrough component assembled with a conductive housing.

In use, one or more ceramic RF feedthroughs can be assembled with a conductive housing to form a hermetically sealed and electromagnetically shielded package for RF electrical circuits. In FIGS. 3 and 4, a radio frequency (RF) electrical circuit package 200 comprises an electrically shielded housing 210 comprising a conductive opening 212 extending through a wall portion 214 of the housing. The circuit package can also comprise an opening 216 through which an electrical circuit can be installed within the housing before a cover (not shown) is placed over the opening and hermetically sealed. The housing can comprise a metallic material or an insulator coated with a conductive material on an inner or outer surface of the housing for electromagnetic shielding. The conductive opening 212 can be contiguous with other conductive parts of the housing. A ceramic RF feedthrough 100 assembled with the housing 210 comprises a non-ferrous conductor 116 adhered to an outer peripheral surface of a ceramic body 110 as described herein. A non-ferrous conductive lead 120 disposed through the aperture is electrically connected to a non-ferrous conductor on the inner peripheral surface of the aperture as described herein. The ceramic body 110 of the RF feedthrough 100 is disposed in the conductive opening 212 of the housing. The non-ferrous conductor 116 on the outer peripheral surface of the ceramic body is electrically connected to the conductive opening 212. A hermetic seal between the conductive opening 212 and the ceramic body 110 can be formed by a high temperature non- leaching solder described herein. The ceramic RF feedthrough 100 shown in FIGS. 3 and 4 can be implemented according to any of the representative implementations disclosed and otherwise suggested herein.

While the disclosure and what is presently considered to be the best mode thereof has been described in a manner establishing possession and enabling those of ordinary skill in the art to make and use the same, it will be understood and appreciated that there are many equivalents to the representative embodiments described herein and that myriad modifications and variations may be made thereto without departing from the scope and spirit of the invention, which is to be limited not by the embodiments described, but by the appended claims and their equivalents.

What is claimed is:

1. A radio frequency (RF) feedthrough component comprising:
   a ceramic body having an outer peripheral surface and an aperture with an inner peripheral surface;
   a non-ferrous conductor adhered to the outer peripheral surface of the ceramic body and to the inner peripheral surface of the aperture;
   a non-ferrous conductive lead disposed through the aperture, a portion of the non-ferrous conductive lead disposed in the aperture of the ceramic body and another portion of the non-ferrous conductive lead protruding from at least one side of the ceramic body;
   a non-ferrous hermetic seal between the portion of the non-ferrous conductive lead disposed in the aperture and the non-ferrous conductor adhered to the surface of the aperture;
   wherein a characteristic impedance of the feedthrough is greater than 20 ohms.

2. The RF feedthrough component of claim 1, wherein the non-ferrous conductor is flexible.

3. The RF feedthrough component of claim 2, wherein the non-ferrous conductor comprises interstitial voids.

4. The RF feedthrough component of claim 3, wherein the non-ferrous conductor is a thick-film.

5. The RF feedthrough component of claim 4, wherein the non-ferrous conductor is pure silver and the conductive lead comprises silver.

6. The RF feedthrough component of claim 4 further comprising an adhesion film deposited on the ceramic body, wherein the non-ferrous conductor comprises a thin-film deposited on the adhesion film.

7. The RF feedthrough component of claim 6, wherein the adhesion film comprises a ferrous compound.

8. The RF feedthrough component of claim 3 is a coaxial device, wherein the non-ferrous conductive lead comprises a pin having a diameter between 0.009 inches and 0.030 inches, a diameter of the aperture is between 0.011 inches and 0.032 inches, and an outer diameter of the ceramic body is between 0.071 inches and 0.0470 inches.

9. The RF feedthrough component of claim 8 comprising a 50 ohms impedance, wherein the ceramic body has dielectric constant between 5 and 9.

10. The RF feedthrough component of claim 8 comprising a 75 ohms impedance, wherein the ceramic body has dielectric constant between 5 and 9.

11. A coaxial radio frequency (RF) feedthrough component comprising:
- a ceramic body having an outer peripheral surface and an aperture with an inner peripheral surface;
- a non-ferrous metal web adhered to the outer peripheral surface of the ceramic body and to the inner peripheral surface of the aperture;
- a non-ferrous conductive lead disposed through the aperture, a portion of the non-ferrous conductive lead disposed in the aperture and another portion of the non-ferrous conductive lead protruding from opposite sides of the ceramic body;
- a non-ferrous hermetic seal comprising solder between the portion of the conductive lead disposed in the aperture and the non-ferrous metal web adhered to the surface of the aperture;

wherein a characteristic impedance $Z_o$ of the coaxial RF feedthrough is greater than 20 ohms.

12. The coaxial RF feedthrough component of claim 11 comprising a lowpass cutoff frequency between 75 GHz and 8 GHz given by the expression $$\text{Cutoff Frequency (GHz)} = \frac{11.8}{\sqrt{\varepsilon_r} \times \pi \times \left(\frac{D+d}{2}\right)}$$

where D is the outer diameter of the ceramic body, d is the diameter of the aperture, and $\varepsilon_r$ is the relative dielectric constant of the ceramic body.

13. The coaxial RF feedthrough component of claim 12, wherein the impedance is between 50 ohms and 75 ohms, inclusive.

14. The coaxial RF feedthrough component of claim 12, the non-ferrous metal web comprising interstitial voids, wherein the non-ferrous metal web is flexible.

* * * * *